(12) United States Patent
Dörner et al.

(10) Patent No.: US 7,049,803 B2
(45) Date of Patent: May 23, 2006

(54) SOLAR MODULES WITH A TRANSPARENT POLYURETHANE FRONT SIDE AND A PROCESS FOR PRODUCING SAME

(75) Inventors: Karl-Heinz Dörner, Pulheim (DE); Hubert Ehbing, Südlohn (DE); Christian Hässler, Krefeld (DE); Jürgen Ramthun, Bergisch Gladbach (DE); Gunther Stollwerck, Krefeld (DE); Robert Eiben, Lampertheim (DE); Michael Niedermeyer, Altlussheim (DE); Peter Schuster, Altrip (DE)

(73) Assignee: Bayer Aktiengesellschaft, Leverkusen (DE)

( * ) Notice: Subject to any disclaimer, the term of this patent is extended or adjusted under 35 U.S.C. 154(b) by 534 days.

(21) Appl. No.: 10/047,365

(22) Filed: Jan. 14, 2002

(65) Prior Publication Data
US 2002/0148496 A1    Oct. 17, 2002

(30) Foreign Application Priority Data
Jan. 17, 2001  (DE)  ................................ 101 01 770

(51) Int. Cl.
*H01L 35/00*   (2006.01)
*G05F 1/67*   (2006.01)
*B32B 27/40*   (2006.01)

(52) U.S. Cl. ..................... 323/906; 428/423.1; 136/254

(58) Field of Classification Search ............. 428/423.1, 428/426; 136/243, 244, 252, 254; 323/906
See application file for complete search history.

(56) References Cited

U.S. PATENT DOCUMENTS

| 4,830,038 | A | | 5/1989 | Anderson et al. ............ 136/251 |
| 5,008,062 | A | | 4/1991 | Anderson et al. ...... 264/272.15 |
| 5,667,595 | A | * | 9/1997 | Vaverka et al. ............. 136/251 |
| 6,245,987 | B1 | * | 6/2001 | Shiomi et al. ............... 136/244 |

* cited by examiner

Primary Examiner—Thao T. Tran
(74) Attorney, Agent, or Firm—Joseph C. Gil; Lyndanne M. Whalen

(57) ABSTRACT

Solar modules in which the front side is composed of transparent polyurethane are made by RIM, injection molding and casting processes and combinations thereof.

8 Claims, 1 Drawing Sheet

1 Transparent polyurethane
3 Solar cells
4 Cell connector

1 Transparent polyurethane
2 Opaque polyurethane
3 Solar cells
4 Cell connector

1 Transparent polyurethane
3 Solar cells
4 Cell connector
5 Module rear side (e.g. plastic) with solar cell fixing

SOLAR MODULES WITH A TRANSPARENT POLYURETHANE FRONT SIDE AND A PROCESS FOR PRODUCING SAME

BACKGROUND OF THE INVENTION

The invention relates to solar modules having a transparent polyurethane front side and to a process for producing such modules.

By "solar modules" is meant photovoltaic components for the direct generation of electric power from sunlight. Key factors in cost-efficient generation of solar power are the efficiency of the solar cells used and the production cost and lifetime of the solar modules.

A solar module is conventionally composed of a front side made of glass, interconnected solar cells, an embedding material and a rear-side structure. The individual layers of the solar module have to fulfill the functions described more fully below.

The glass front side serves as protection against mechanical and atmospheric influences. It has to exhibit maximum transparency in order to minimize, as far as possible, absorption losses in the optical spectral region from 300 nm to 1150 nm, and hence efficiency losses of the silicon solar cells conventionally used for power generation. Hardened white glass (3 or 4 mm thick) with a low iron content having a transmittance in the aforesaid spectral region amounting to 90–92% is normally used.

The embedding material (EVA (ethyl-vinyl acetate) films are generally used) serves as the adhesive for the whole module composite. EVA melts during a lamination operation at about 150° C., flows into the gaps between the soldered solar cells and is thermally crosslinked. Formation of air bubbles which leads to reflection losses is prevented by lamination under vacuum.

The module rear-side protects the solar cells and the embedding material against humidity and oxygen. In addition, it serves as mechanical protection against scratching etc. during assembly of the solar modules and as electrical insulation. The rear-side structure may be made either of glass or, more commonly, of a composite film. In the main, the variants PVF (polyvinyl fluoride)-PET (polyethylene terephthalate)-PVF or PVF-aluminium-PVF are used.

The encapsulation materials used in solar module construction should, in particular, exhibit good barrier properties against water vapor and oxygen. Although the solar cells themselves are not attacked by water vapor or oxygen, corrosion of the metal contacts and chemical degradation of the EVA embedding material may take place. A broken solar cell contact leads to a complete failure of the module, since normally all of the solar cells in a module are interconnected in series electrically. A degradation of the EVA manifests itself in a yellowing of the module, combined with a corresponding reduction in power due to light absorption and a visual deterioration. Today about 80% of all modules are encapsulated on the rear side with one of the composite films described, and in about 15% of solar modules, glass is used for the front and rear sides. Where a composite film or glass is used for both the front and rear sides, highly transparent casting resins are sometimes used as embedding materials instead of EVA. These highly transparent casting resins cure slowly (several hours).

In order to achieve competitive production costs for solar power despite the relatively high capital costs, solar modules must achieve long operating times. Present-day solar modules are therefore designed for a service life of 20 to 30 years. In addition to high stability under atmospheric conditions, major requirements are made of the thermal endurance of the modules, whose temperature during operation may vary cyclically between 80° C. in full sunlight and temperatures below freezing. Solar modules are subjected to comprehensive stability tests (standard tests to IEC 1215) which include atmospheric tests (UV irradiation, damp heat, temperature change), hail tests and high voltage insulation tests.

Module construction, which accounts for 30% of the overall cost, represents a relatively high proportion of the production costs for photovoltaic modules. This large share in the module manufacture is caused by high material costs (hail-proof 3–4 mm thick front glass, multi-layer film on rear side) and by long process times, i.e. low productivity. In many cases, the individual layers of the module composite, that have been described above, are still assembled and aligned manually. In addition, the relatively slow melting of the EVA hot melt adhesive and the lamination of the module composite at approx. 150° C. under vacuum lead to production cycle times of 20–30 minutes per module.

Due to the relatively thick front glass pane (3–4 mm), conventional solar modules have a high weight, which makes stable and expensive holding structures necessary. The heat dissipation problem has also not been solved satisfactorily in present-day solar modules. Under full sunlight, the modules heat up to a temperature of 80° C., which leads to a temperature-induced deterioration of the solar cell efficiency and, in the final analysis, to an increase in the price of solar power.

Various attempts to reduce the module production costs by using cheaper (i.e. first and foremost, more rapid) production methods have not proven successful to date. In U.S. Pat. Nos. 4,830,038 and 5,008,062, the rapid foaming around the module rear side of thin-film solar modules with polyurethane foams by the RIM (Reaction Injection Moulding) method is described. Such thin-film solar cells are deposited (e.g. by chemical gas phase deposition) directly onto the rear side of the front glass of the solar module, thereby eliminating the need for an embedding material between the front- and rear-sides of the module. Currently, however, only about 10% of all solar cells are manufactured by thin film technology. The predominant solar cells are based on the technology of crystalline silicon wafers.

SUMMARY OF THE INVENTION

The object of this invention is the development of low weight photovoltaic modules which can be produced by a rapid, simple and cost-effective method.

This and other objects which will be apparent to one skilled in the art are achieved by using a transparent polyurethane as the front side of a solar module.

DETAILED DESCRIPTION OF THE INVENTION

Figure 1:
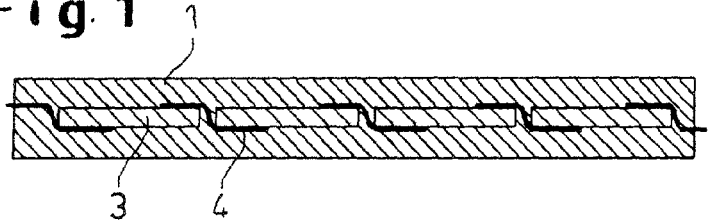
FIG. 1 illustrates a solar module in which solar cells are completely embedded in a polyurethane material.

Polyurethane, in comparison with materials currently used in solar module construction, offers high stability under atmospheric conditions, the advantage of low material costs, a low density and hence a low weight and rapid (a few minutes) processability at low temperatures of around 100° C.

In a preferred embodiment of the invention, the solar cells are completely embedded in transparent polyurethane. It is also possible, however, to use a transparent polyurethane for the front side and a material such as an opaque polyurethane for the rear side.

As used herein, a "transparent polyurethane" is a polyurethane which at a layer thickness of 1 mm exhibits a transmission of >85% at wavelengths in the range between 400 nm and 1150 nm preferably 400 nm and 900 nm. Transparent polyurethanes are, for example, produced from aliphatic polyisocyanates, such as low-viscosity hexamethylene diisocyanate (HDI)-trimers having a viscosity of 1000–3000 mPa·s at 23° C., an NCO content of 21–25%, an equivalent weight of 170–190 g/mole and a density of 1.0–1.2 g/cm$^3$ and low-viscosity polyester polyols (viscosity at 23° C. 1500–2500 mPa·s, hydroxyl value 480–560, equivalent weight of 100–120 g/mole with a density of 1.0–1.2 g/cm$^3$). An example of a suitable transparent polyurethane system is the system available under the designation Bayflex® VP.PU 14IF02/VP.PU 18IF11 from Bayer AG.

As used herein, an "opaque" polyurethane is a standard polyurethane which is opaque to visible light, e.g. black colored. Examples of suitable opaque polyurethane systems are the systems available under the designations Bayflex® VP.PU 43IF13/VP.PU 0833 or Baydur® VP.PU 71BD03/VP.PU 26IK01 from Bayer AG.

In addition to opaque polyurethanes, the rear side of the module may also be composed of a plastic (e.g. polycarbonate, polymethyl methacrylate, fluoroplastics), glass fiber reinforced plastics or metal-plastic multi-layer systems.

The mechanical stability of the module may be ensured both by the rear side and by the front side. The main requirement for the front side of the solar module is a high transparency in the visible and infrared spectral region of from 300 nm to about 1500 nm, preferably of from 300 nm to 1150 nm, in order to guarantee a high photoelectric efficiency of the solar cells. Front and rear sides of the module must both exhibit generally high stability under atmospheric conditions (e.g., to UV radiation) and protect the embedded solar cells against corrosion by suitable barrier properties (e.g., against water vapor and oxygen).

Transparent polyurethane systems useful for covering the front of the solar modules may be produced from systems which include an aliphatic polyisocyanate and a caprolactone polyol having a viscosity at 23° C. of 600–1000 mPa·s, a hydroxyl value of 290–340, an equivalent weight of 500–600 g/mole and a density of 1.0–1.2 g/cm$^3$. Polyurethanes produced from these materials possess improved ageing properties in terms of the thermo-oxidation of the polyurethane, together with a higher UV stability. Amines or phenols may also be included in the polyurethane-forming reaction mixture in a concentration of about 1% in order to further increase the UV stability.

Significant factors affecting the long-term stability of solar modules are thermal stress due to changing temperatures and differing coefficients of expansion of the materials used. The stress resulting from these factors is capable of delaminating or even destroying the module composite.

Preferably the opaque polyurethane useful for the rear side of the module contains fillers, so that the thermal expansion coefficient of the polyurethane is reduced, and hence the difference in expansion coefficients between solar cells (mostly silicon, expansion coefficient approx. $3 \times 10^{-6}$ $K^{-1}$) and polyurethane (expansion coefficient $100–200 \times 10^{-6}$ $K^{-1}$) is diminished. Fillers such as chalk, glass platelets or silicates may be used to reduce the thermal expansion coefficient of the opaque polyurethane, with filler concentrations in the polyurethane system of 10 to 25%.

In a preferred embodiment of the present invention, the polyurethane contains additives which increase the thermal conductivity (e.g. copper in powder form).

Efficient cooling of the solar modules leads, in general, to an increase in the solar cell efficiency. The surface of the polyurethane, in particular its rear side, may be constructed in the form of cooling fins.

In a preferred form of embodiment, the solar modules contain additional fixing and/or reinforcing elements and/or electrical function elements. Typical elements are fixing clamps for the subsequent fitting of the solar modules, electrical junction boxes and rod-, plate, or grid-shaped reinforcing elements of a plastic material or a metallic material. These additional elements may be assimilated into the construction of the module during the polyurethane shaping process, and also be used for the mechanical stabilizing of the solar cells within the mold.

In a preferred embodiment of the invention, the additional function element is present on the module rear side and possesses a configuration (e.g. grooves, depressions) which permits a simple fixing or securing of the solar cells for the polyurethane shaping process. The module rear side may, e.g., be made of a thermoformable composite film. The latter is either formed separately, and the solar cells including the connecting elements are introduced subsequently, or the composite film is thermo-formed together with the solar cells, so that a fixing onto and through the rear side takes place directly.

In another preferred embodiment of the invention, the solar modules possess a textured surface, particularly the front side.

Compared to glass, polyurethanes have the advantage of simpler mechanical workability or simple formability during the production process. This makes it relatively easy to texture the surface, thereby increasing light absorption through surfaces turned obliquely towards the light and hence the efficiency of the solar modules.

Both wafer-type solar cells and thin-film solar cells may be used as solar cells in the modules of the present invention.

If thin-film solar cells are used, the deposition of the solar cells on suitable substrates (e.g., glass, plastic or ceramic) may take place. The thin-film solar cells on such a substrate are then embedded completely in transparent polyurethane which ensures protection against mechanical effects and atmospheric influences. The substrate of the thin-film solar cells may also function as the rear side of the module and only the front side of the module be manufactured of polyurethane.

The solar modules of the present invention may be produced by a process in which the transparent polyurethane is applied to the solar cells by means of a RIM process (Reaction Injection Moulding), a casting process, an injection molding process or combinations thereof. Such processes are described, for example, in Kunststoffhandbuch Nr. 7 "Polyurethane" by G. Oertel, Carl Hanser Verlag 1993

(pages 139–152) (general description and casting processes), pp. 356–368 (RIM process), pp. 333–334 (injection molding process). Additional details on the processing of transparent polyurethane systems are given in EP-A1-0 978 523.

The solar cells are positioned in a mold in such a way that the optically active side faces the hollow of the mold, the so-called cavity. The reaction system is then injected into the cavity, preferably by a high-pressure method, and forms the transparent cover of the solar cells.

Alternatively, a low-pressure method or a pressure-less casting method may be used. In order to obtain a blister-free solar cell cover, the initial components of the reaction system should be devolatilized prior to fabrication. In addition, pronounced flow deflections and large pressure jumps are to be avoided during the introduction of the reaction system into the cavity. The pressure in the cavity is such that gas bubbles which form will be compressed. The appropriate pressure is dependent on the size of the cavity, the viscosity of the reaction system and the solubility of the gas in the system. The cavity pressure may be increased subsequently by a compression in the same or in an additional mold.

In a particularly preferred embodiment of the invention, the solar modules are produced by a process in which the solar cells are encapsulated with transparent polyurethane in one step by injection molding.

In another preferred embodiment, the solar modules of the present invention are produced by a process in which transparent polyurethane is injected in one step onto solar cells already fixed to a component serving as the rear side of the module.

In a further embodiment of the present invention, the solar modules of the present invention are produced by a process in which the transparent polyurethane front side is first injected or cast onto the solar cells and in a second step, the polyurethane rear side is injected or cast onto the solar cells. Alternatively, the polyurethane rear side may be injected or cast onto the solar cells first and then the transparent front side is injected or cast onto the solar cells.

It is preferred that the solar modules of the invention be produced by a process in which fixing and reinforcing elements, as well as electrical function elements, are introduced into the cavity and are fixed to the component by encapsulation with the polyurethane system by injection molding. In this case, prior to the encapsulation by injection molding, the fixing or reinforcing elements are positioned in the mold at the desired points. Selection of suitable points in the mold at which to position such fixing or reinforcing elements is within the skill of those in the art. (See, e.g., Kunststoffhandbuch Nr. 7 "Polyurethane" by G. Oertel, Carl Hanser Verlag 1993 (pages 397–400).)

Figure 2:
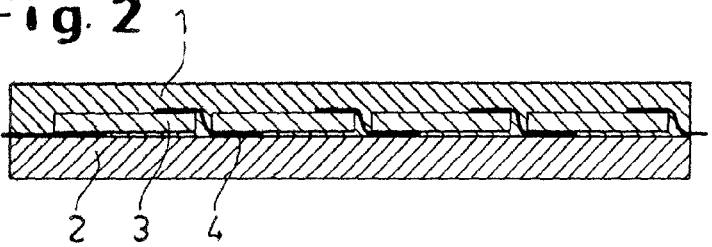
FIG. 2 illustrates a solar module in which solar cells are embedded in two different polyurethane materials.
Figure 3:
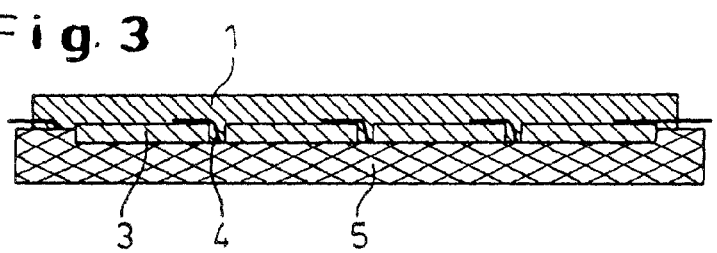
FIG. 3 illustrates a solar module in which the front side is a transparent polyurethane and the back side is a molding to which the solar cells have been fixed.

The invention will be explained in detail by way of example from the attached Figures, in which FIG. 1 shows a solar module in which the solar cells are embedded completely in polyurethane material, FIG. 2 shows a solar module in which the solar cells are embedded in two different polyurethane materials and FIG. 3 shows a solar module in which the front side is composed of transparent polyurethane and the rear side is composed of a molding in which the solar cells are fixed.

In FIG. 1, the components of the solar module include a transparent polyurethane front side ("face") molding 1 in which the solar cells 3 connected by cell connectors 4 are embedded.

A particular advantage of this structure is the possibility of a rapid and atmospherically stable embedding of the solar cells in only one operation.

In FIG. 2, the components of the solar module include a transparent polyurethane molding 1 as front side and an opaque polyurethane molding 2 as rear side. The solar cells 3 connected by cell connectors 4 are embedded into the front side 1. The rear side may ensure mechanical stability.

In FIG. 3, the components of the solar module include a transparent polyurethane front side molding 1 and a module rear side 5. The module rear side 5 includes a configuration (e.g. grooves, depressions) which is suitable for fixing the solar cells 3 and the cell connectors 4 during the injecting or casting of the transparent polyurethane.

EXAMPLES

Example 1

Solar cells encapsulated by means of transparent polyurethane were produced by a RIM ("reaction injection molding") process. For test purposes, two solar cells, each with an area of approx. $5 \times 5$ cm$^2$, were soldered to one another. The solar cells were first positioned in the mold on supports. After closure of the mold, the reaction mixture, Bayflex® VP.PU 14IF02/VP.PU 18IF11 (available from Bayer AG), was injected and flowed around the solar cell in which the supports had been included.

The transparent polyurethane system (Bayflex® VP.PU 14IF02/VP.PU 18IF11 available from Bayer AG) included an aliphatic polyisocyanate (low-viscosity HDI-trimer, viscosity at 23° C. 1200 mPa·s, NCO content 23%, monomeric HDI <0.25%, equivalent weight 183 g/mole, density 1.16 g/cm$^3$) and a short-chain polyester polyol (viscosity at 23° C. approx. 1900 mPa·s, hydroxyl content 16% or hydroxyl value 528, water content <0.2%, equivalent weight 106 g/mole, density 1.05 g/cm$^3$). 1% of dibutyl-tin-dilaurate (DBTL), based on total amount of system, was used as the catalyst.

In preliminary tests, a glass fiber reinforced polycarbonate plate (dimensions $15 \times 15$ cm$^2$) was used as the module rear side to which the solar cells were bonded. The mold-dependent injection rate of the reaction mixture was selected so that sufficient mixing in the mixhead was ensured and the flow rate was not too high so that, as a result of shear and high flow rates, the gas dissolved in the system formed gas bubbles which would remain in the polyurethane and reduce the transparency of the encapsulation through light scattering. The injection rate of the reaction system should be as high as possible, in order to achieve a short cycle time, but high pressure jumps should be avoided as much as possible in order to prevent bubble formation. A short pouring time with a low injection rate may alternatively be achieved by a large volume flow rate with large feed opening.

The efficiency of the test solar modules manufactured in the manner described above was measured under a solar simulator with a sun-type spectrum and amounted to 10.5% both before and after the encapsulation with transparent polyurethane by injection molding.

The solar modules described were produced under the process conditions shown in Table 1.

TABLE 1

| | |
|---|---|
| Injection time [s] | 1 |
| Mold temperature [° C.] | 90 |
| Mixing pressure [bar] | 200 |
| Mold time [s] | 60 |

Example 2

In this example, a casting process was to encapsulate to solar cells (each having an area of approximately 5×5 cm$^2$) soldered to each other in transparent polyurethane. A glass fiber reinforced polycarbonate plate (thickness approx. 3 mm) served as the rear side. The solar cells were fixed to the rear side by means of adhesive. Alternatively, the shaping of the rear side could be used to fix the solar cells (e.g., by means of depressions). After the solar cells had been fixed, the transparent polyurethane system was cast onto the solar cells. At the same time, a homogeneous mixing of the two components was accomplished with a suitable mixhead. A reaction mixture available from Rheinchemie GmbH was used. This reaction mixture included an aliphatic polyisocyanate commercially available under the designation RC-DUR 302 (HDI trimer, biuret compound, viscosity at 23° C. approx. 2500 mPa·s, NCO content 23%, monomeric HDI <0.5%, equivalent weight 183 g/mole, density 1.13 g/cm$^3$) and a caprolactone polyol commercially available under the designation RC-PUR KE 9675 (viscosity at 23° C. approx. 800 mPa·s, hydroxyl value 310, water content <0.05%, equivalent weight 540 g/mole, density 1.1 g/cm$^3$). The curing time of the reaction mixture was from about 2 to 3 minutes. A completely blister-free embedding of the solar cells was achieved. The surface of the transparent polyurethane layer was even, the layer thickness was approx. 2–3 mm.

The efficiency of this solar module was also measured under a solar simulator as in Example 1 and amounted to 12.1% both before and after embedding the solar cells by casting in transparent polyurethane.

Although the invention has been described in detail in the foregoing for the purpose of illustration, it is to be understood that such detail is solely for that purpose and that variations can be made therein by those skilled in the art without departing from the spirit and scope of the invention except as it may be limited by the claims.

The invention claimed is:

1. A solar module comprising
   a) at least one solar cell,
   b) a front side composed of transparent polyurethane, and
   c) a rear side.
2. The solar module of claim 1 in which the rear side is composed of transparent polyurethane.
3. The solar module of claim 1 in which the rear side is composed of plastic, glass or ceramic.
4. The solar module of claim 1 in which the rear side is composed of opaque polyurethane.
5. The solar module of claim 4 in which the opaque polyurethane contains a filler.
6. The solar module of claim 5 in which the filler is selected from the group consisting of chalk, glass platelets, silicates and combinations thereof.
7. The solar module of claim 1 in which the front side has a textured surface.
8. The solar module of claim 1 in which the rear side is constructed in the form of cooling fins.

* * * * *